United States Patent [19]

Berger et al.

[11] Patent Number: 4,810,881
[45] Date of Patent: Mar. 7, 1989

[54] PANEL FOR X-RAY PHOTOGRAPHY AND METHOD OF MANUFACTURE

[75] Inventors: Jean L. Berger; Marc Arques, both of Grenoble, France

[73] Assignee: Thomson-CSF, Paris, France

[21] Appl. No.: 41,020

[22] Filed: Apr. 21, 1987

[30] Foreign Application Priority Data

Apr. 30, 1986 [FR] France .................. 86 06334

[51] Int. Cl.⁴ ................................. H01L 31/00
[52] U.S. Cl. .................. 250/370.01; 250/370.09; 250/370.11; 357/32; 437/3
[58] Field of Search .............. 250/366, 367, 370 R, 250/370 G, 370 G, 370 H, 370 I, 370 K, 252.1; 437/3, 86, 48, 974, 5; 357/32

[56] References Cited

U.S. PATENT DOCUMENTS

| | | | |
|---|---|---|---|
| 3,864,722 | 2/1978 | Carnes ..................... | 250/370 G |
| 4,059,766 | 11/1977 | Rougeot ................... | 250/366 |
| 4,101,924 | 7/1978 | Brown et al. ............. | 250/370 R |
| 4,257,057 | 3/1981 | Cheung et al. ........... | 250/370 G |
| 4,292,645 | 9/1981 | Schlosser et al. ........ | 250/370 G X |
| 4,331,873 | 5/1982 | Miller et al. ............. | 250/370 G |
| 4,417,144 | 11/1983 | Hoffman et al. .......... | 250/370 I |
| 4,424,446 | 1/1984 | Inbar et al. .............. | 250/252.1 |
| 4,471,227 | 9/1984 | D'Ascenzo ............... | 357/32 |
| 4,583,108 | 4/1986 | Sirieix ..................... | 357/32 |

FOREIGN PATENT DOCUMENTS

| | | |
|---|---|---|
| 125691 | 5/1984 | European Pat. Off. . |
| 153251 | 2/1985 | European Pat. Off. . |
| 3531448 | 9/1985 | Fed. Rep. of Germany . |
| 2335056 | 9/1975 | France . |

OTHER PUBLICATIONS

H. Rougeot "Les detecteurs X sensibles a l'etat solide pour le controle non destructif," Electronique Industrielle, No. 66, Mar., 1984, pp. 19 and 20, Paris, France.

*Primary Examiner*—Janice A. Howell
*Assistant Examiner*—William F. Rauchholz
*Attorney, Agent, or Firm*—Pollock, Vande Sande & Priddy

[57] ABSTRACT

The present invention pertains to a large-sized X-ray photography panel. This panel comprises several modules placed end to end. Each module comprises a network of photosensitive detectors with the same number of columns as the panels but with a smaller number of rows. Each module has its own addressing and reading means. The addressing means are located on an edge of the insulating substrate that bears the detectors. The reading means are located on the other side of the substrate from the detectors. A screen, which is opaque to the radiation to be detected, is interposed between the substrate and these means. These means are liked to the column connections coming from the opposite side of the substrate by connections along one of the side surfaces of the substrate.

13 Claims, 8 Drawing Sheets

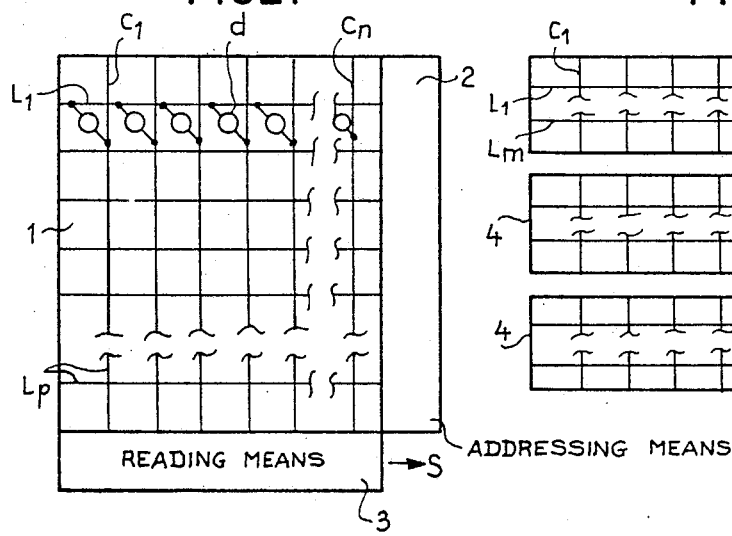
FIG_1
PRIOR ART
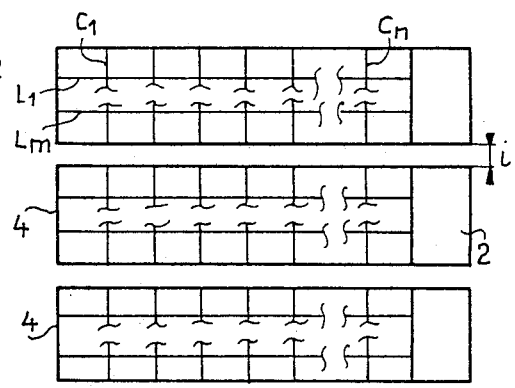
FIG_2
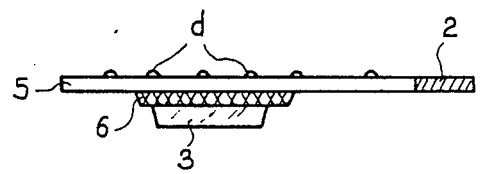
FIG_3

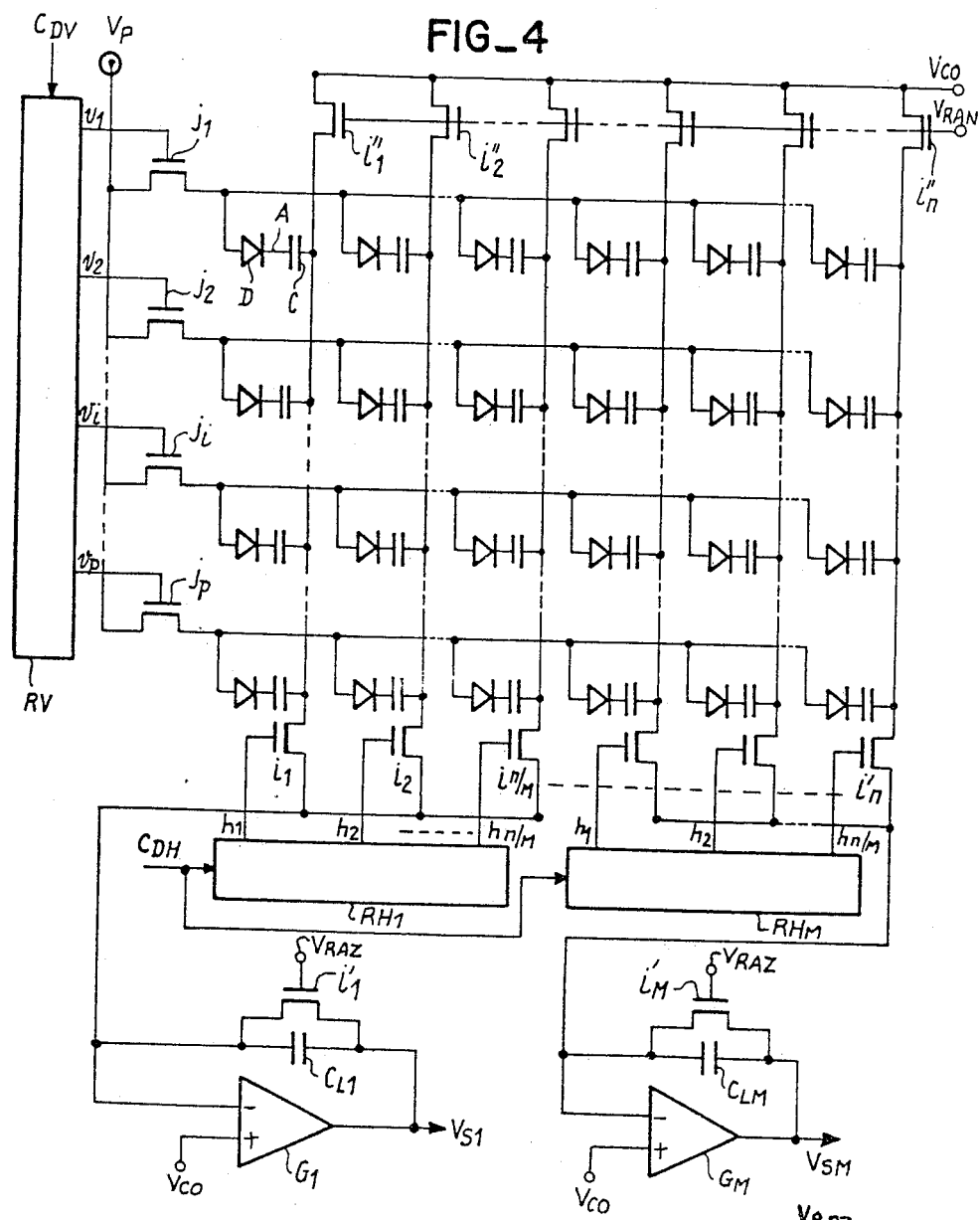
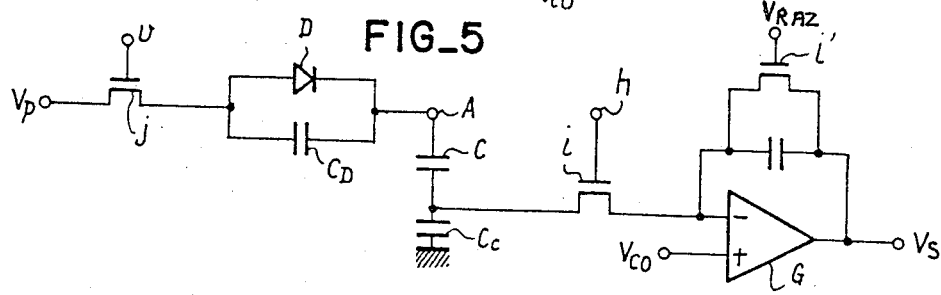

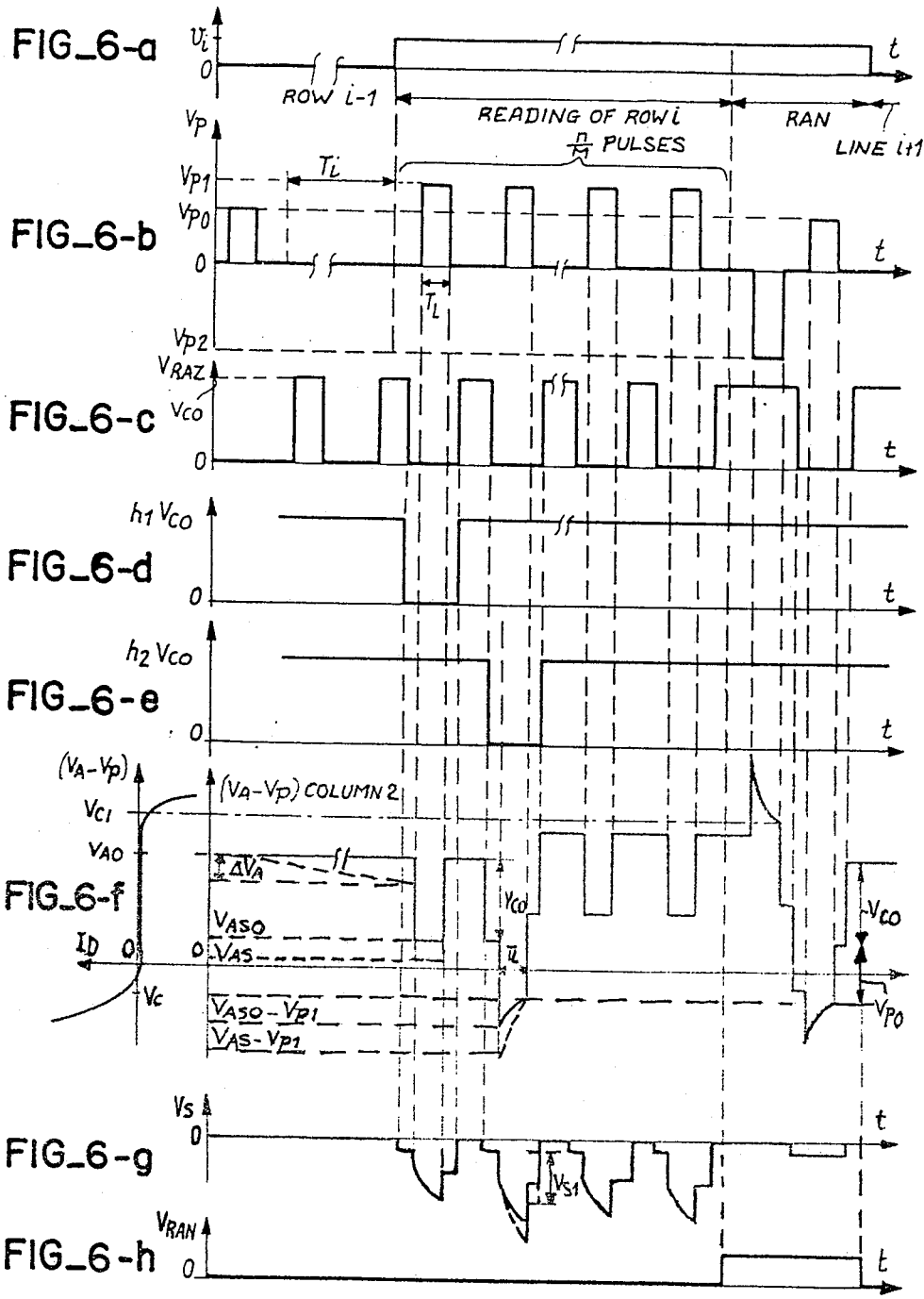

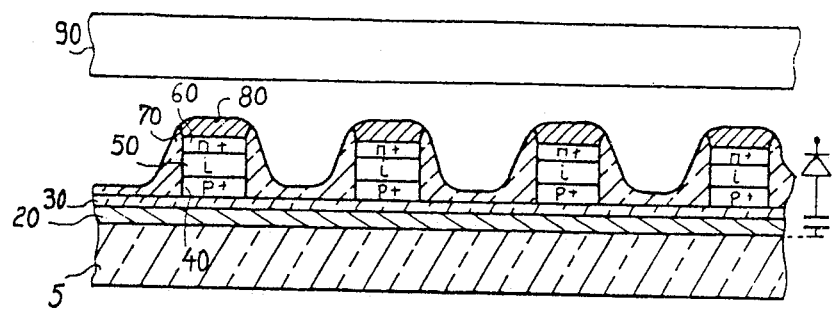
FIG_7-a
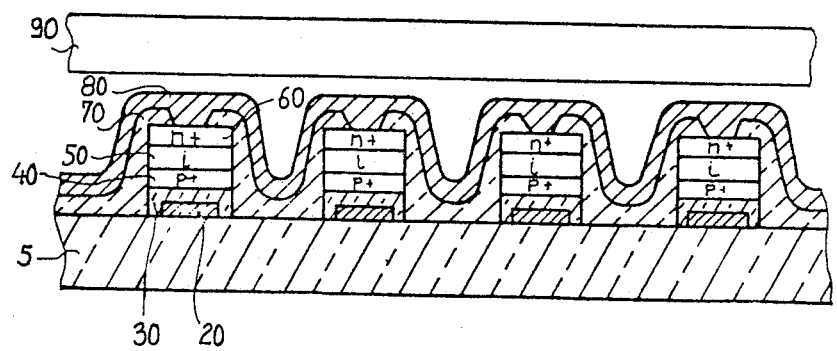
FIG_7-b
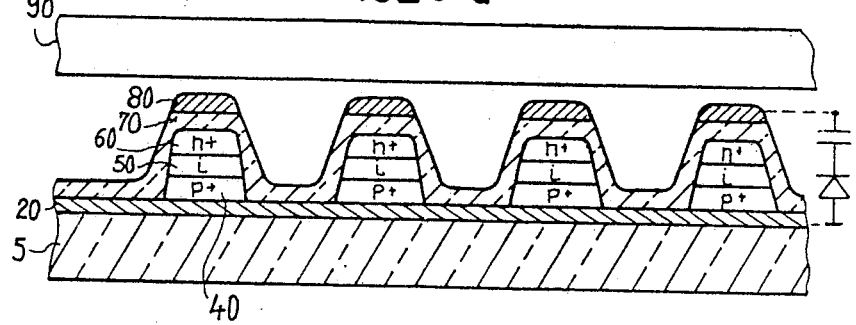
FIG_8-a
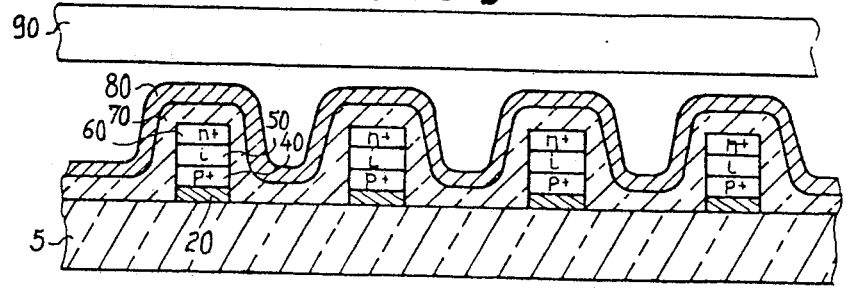
FIG_8-b

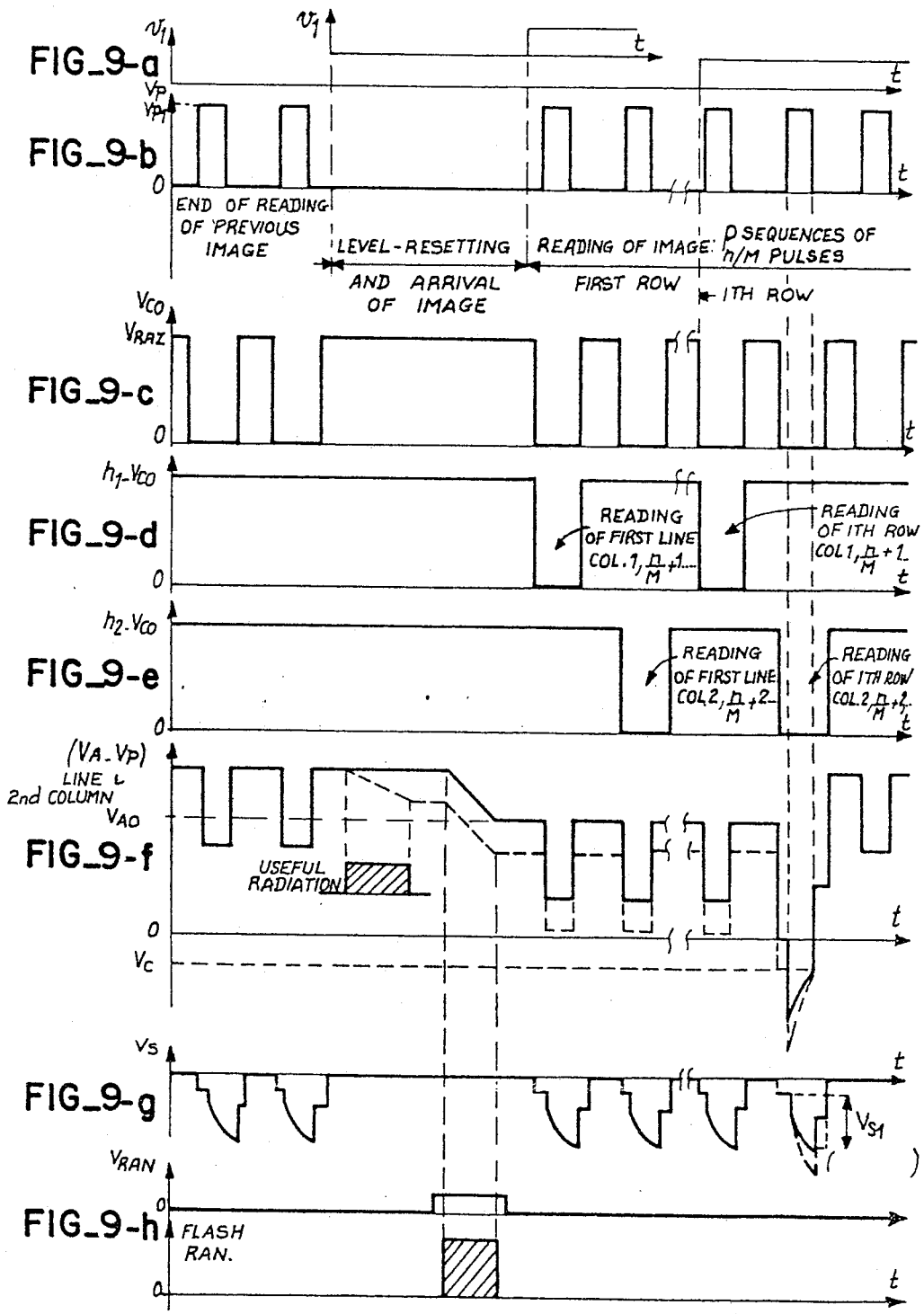

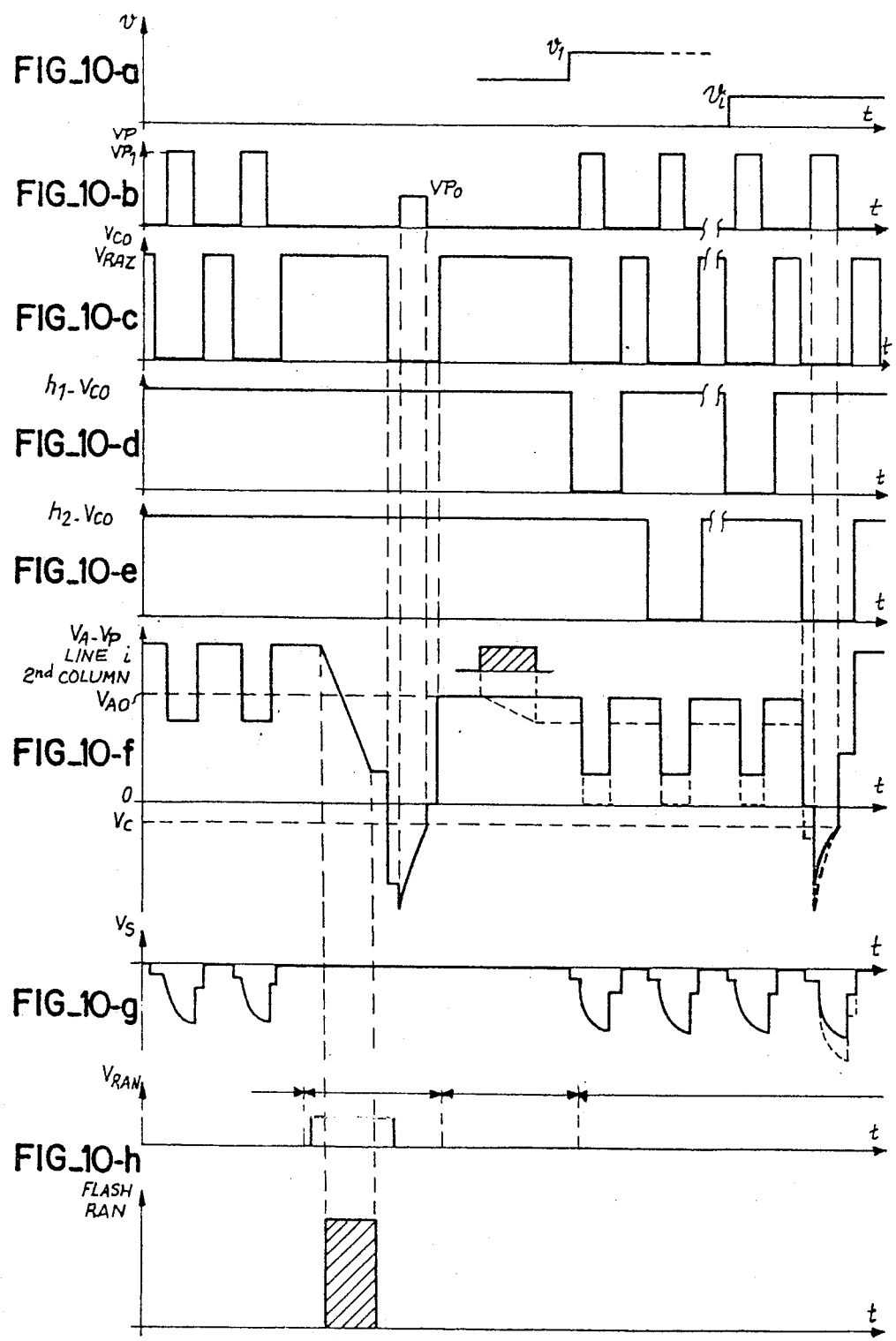

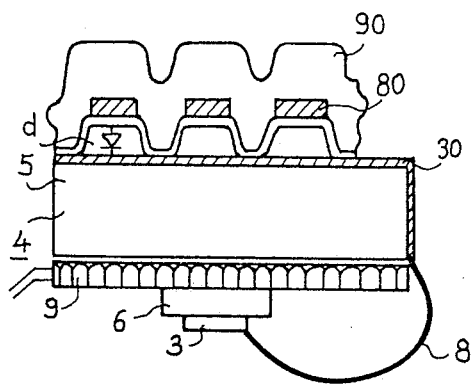
FIG_13
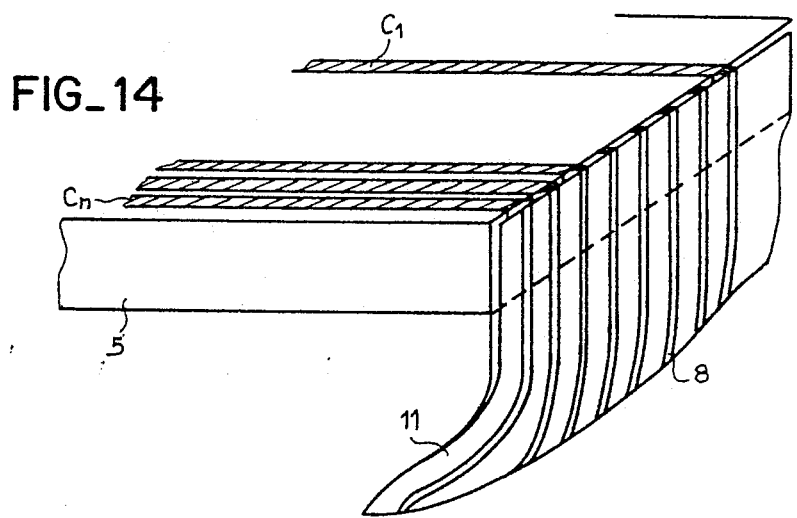
FIG_14
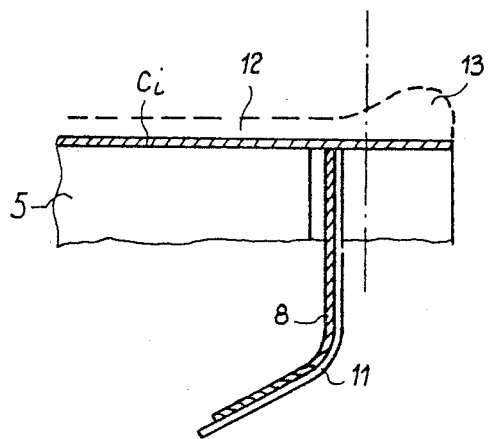
FIG_15

PANEL FOR X-RAY PHOTOGRAPHY AND METHOD OF MANUFACTURE

RELATED APPLICATIONS

This application is related to copending U.S. patent application Ser. Nos. 3,890 and 3,891 (Ser. No. 3,891 corresponds to French patent application No. 86.00716).

FIELD OF THE INVENTION

The present invention pertains to a large-sized X-ray photography panel. It also pertains to a method for the manufacture of panels of this type.

The detection of X-rays in medical or industrial radiology often calls for the use of large-sized panels, for example, square panels with a side of 40 cm.

DESCRIPTION OF THE PRIOR ART

FIG. 1 gives a schematic view of the basic structure of a panel of this type. This panel comprises a network 1 of photo-sensitive detectors d arranged in rows and columns and connected to one another by row connections $L_1$ to $L_P$ and by column connections $C_l$ to $C_n$. For reasons of clarity, figure 1 shows only one row of detectors d. Each detector is connected to a row connection and a column connection.

A scintillator screen (not depicted) is interposed between the X-radiation to be detected and the network of detectors.

Addressing means 2, connected to the row connections, are used for the successive addressing of each row of photosensitive elements. Means 3, connected to the column connections, are used to read the row of photosensitive elements which has been addressed and give the output signal S of the panel.

The photosensitive elements d can exhibit various structures. The French patent application No. 86.00716, filed on Jan. 20, 1986 in the name of THOMSON-CSF, describes networks of photosensitive elements which can be used in radiology and which comprise a photodiode and a capacitor. The advantage of these elements is that they do not comprise any switching element. Rather, a signal, in the shape of pulses, is used for reading in order to control the discharge of the capacitor associated with the photodiode. This type of structure can be used to make large-sized matrices owing to the fact that the thin-film deposits, of amorphous silicon for example, are now well mastered. We shall have to return, later in the description, to this patent application referred to above.

Owing to their large size X-ray photography panels raise several problems:

Each column connection is linked to a large number of photosensitive elements, about 2,000 for example. Now each photosensitive element introduces a considerable capacitance at its column connection. Consequently, the reading time and noise are increased;

The dark currents of all the photosensitive elements linked to one and the same column connection are summed, especially during the reading of the detectors, thus introducing a parasite signal depending on the temperature and noise generator;

Finally, the technological manufacturing difficulty entailed in obtaining a faultless X-ray panel very quickly increases with the area of the panel.

SUMMARY OF THE INVENTION

The present invention proposes a solution to these various problems.

The X-ray photography panel of the invention comprises several modules, placed end to end. Each module comprising a network of photosensitive detectors with the same number of columns as the panel but with a smaller number of rows. Each module has its own addressing and reading means, the addressing means being located on an edge of the isolating substrate which carries photosensitive detectors on the photosensitive detector side. The addressing and reading means are protected from the radiation to be detected by a screen, the reading means being located on the other side of the substrate from the photosensitive detectors, with a screen which is opaque to the radiation to be detected being interposed between the substrate and the addressing and reading means. The addressing and reading means are linked to the column connections coming from the side opposite to the substrate by connections following one of the side surfaces of the substrate.

The present invention also pertains to a method for making a special mode of embodiment of the invention wherein the column connections are connections deposited on one side of the insulating substrate on the detector side, and wherein they are then connections deposited on a flexible insulating support which is bonded to a side surface of the insulating substrate and connected to the reading means. This method comprises the following steps:

(1) Bonding a flexible insulating support carrying conductors to one of the side surfaces of the insulating support;

(2) Lapping the support so that the ends of the connections that it carries are in the same plane as the substrate surface on the detectors side;

(3) Depositing column connections on the substrate surface on the detector side, so that, at the end of the substrate, the connections deposited overlap the connections borne by the flexible insulating support;

(4) Joining the connections carried by the insulating support to the reading means.

The invention can be used to resolve the problems raised by the X-ray photography panels of the prior art as will be explained below.

Since the number of photosensitive elements linked to each connection is smaller in the modules according to the invention, the noise is diminished and, possibly, the reading time. Since each module constituting the panel can be read separately and quickly owing to the fact that it has a small number of rows, two modes of reading can be adopted. In these two modes of reading, it is generally chosen to read all the modules simultaneously. A buffer memory collects the output signals of these modules so that the complete image can be reconstituted.

A first mode of reading preserves the same reading time for the entire panel of the invention as for a unitary panel according to the prior art. A greater time is then available to read each row of detectors. This makes it possible to use addressing means that work at a lower frequency. There is therefore a larger choice of components to implement addressing structures. It is possible, for example, to use amorphous silicon components, the mobility of which is very low as compared with that of crystalline silicon components, but which can be more easily made on large surfaces. In the patent application No. 86.00716, the photosensitive detectors are read by integrator operational amplifiers, and the column connections are multiplexed so that the integrator amplifiers work under satisfactory conditions without excessively increasing their number. Since more time is available to read each row of detectors, it is possible to use amplifiers with a lower frequency response, leading to a reduction in noise. Finally, the multiplexing, like the addressing, can be done at a lower frequency and there is a greater choice of components that can do this multiplexing.

In a second mode of reading, the reading time of the entire panel is reduced. Thus, this mode preserves the same reading time for each row of detectors as in the panels of the prior art. Thus, the contribution of the dark current is reduced and the number of images obtained per second is increased.

Since the number of photosensitive elements linked to each column connection is diminished, the parasitic signal introduced by the dark current and the noise which is associated with it are reduced by the same degree.

Finally, the manufacturing efficiency is increased owing to the small area of the modules to be made.

The invention has the following advantages. It is easier to test small-sized modules than a single large-sized panel. The modules are interchangable and it is possible to assemble them in any number according to requirements. The noise introduced by the means for addressing the row connections is also reduced because these addressing means address only a small number of row connections.

BRIEF DESCRIPTION OF THE DRAWINGS

Other objects, characteristics and results of the invention will emerge from he following description which is given as a non-exhaustive example and illustrated by the appended figures, of which:

FIG. 1 and FIG. 2 are a schematic depiction of a X-ray photography panel according to the prior art and according to the invention respectively;

FIG. 3 is a cross-section view of a module of the panel of FIG. 2;

FIG. 4 is a schematic depiction of an X-ray photography panel described in the French patent application No. 86.00716;

FIG. 5 is a diagram of a detail of a photosensitive element of the panel of FIG. 4, and of the associated reading means;

FIGS. 6a to 6h are signals that explain the working of the panel of FIG. 4 and a first alternative embodiment of the reading method of this panel;

FIGS. 7a and b and 8a and b are cross-section views along a column and a row of two modes of embodiment of the panel of FIG. 4;

FIGS. 9a to 9h and FIGS. 10a to 10h are drawings of signals explaining the functioning of the panel of FIG. 4, with a second and third alternative embodiment of the method for reading this panel;

FIG. 13 is a special mode of embodiment of a module according to the invention;

FIG. 14 is a perspective view of the insulating substrate 5 carrying the column connections linked to the reading means;

FIG. 15 is a cross-section view of the insulating substrate 5 illustrating the stage in the method by which the connections between the column connections and the reading means are set up.

DESCRIPTION OF THE PREFERRED EMBODIMENTS

Figure 11:
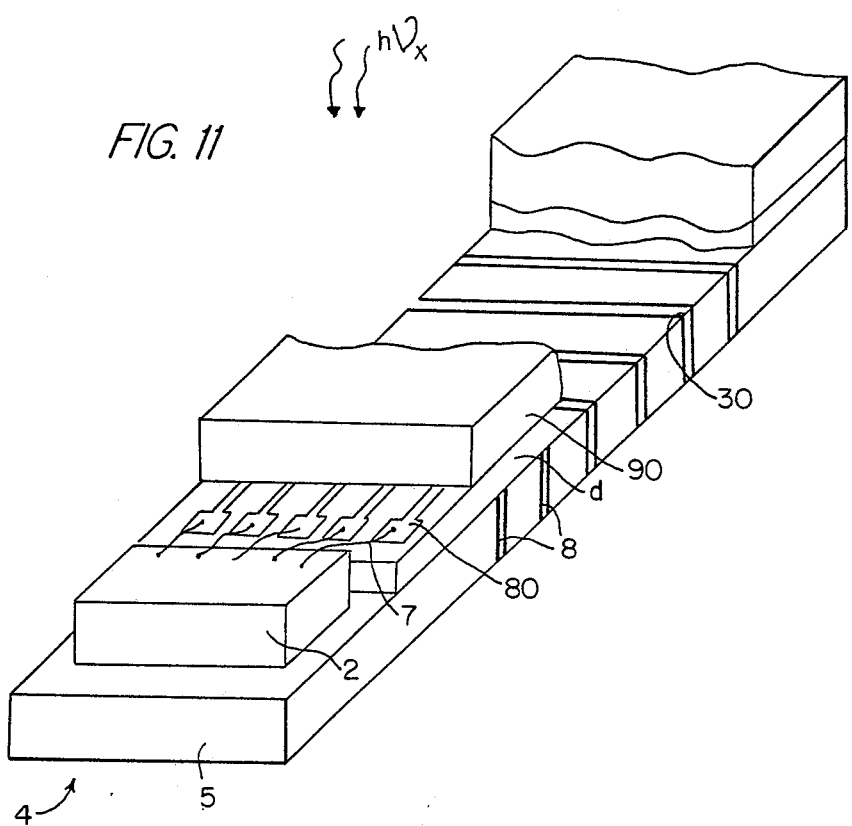
FIG. 11 is an exploded perspective view showing the embodiment, in integrated form, of a module according to the invention.

In the various figures, the same references designate the same elements but, for reasons of clarity, the dimensions and proportions of the various elements are not maintained.

FIG. 1 was described in the introduction to the description.

FIG. 2 depicts the modifications made in the X-ray photography panel of the prior art depicted in FIG. 1. The panel according to the invention comprises several independent modules, bearing the reference 4, which are placed end to end. Each module comprises a network of photosensitive elements, arranged in rows and columns, with row connections and column connections which connect the detectors to one another as in the prior art. The number of columns of detectors and connection columns $C_l$ to $C_n$ is not modified. However, the number of rows of detectors and row connections is reduced. Each module 4 has m rows of detectors and m connections of rows with m being less than p.

FIG. 3 is a cross-section view of FIG. 2 which shows that the detectors d, one row of which is depicted, are set on an insulating substrate 5, made of glass for example.

Each module has its own addressing means 2 linked to its row connections. It can be seen in FIGS. 2 and 3 that the addressing means are located on the upper surface of the substrate 5, on the detectors side and on an edge of the substrate. The addressing means are located on an edge of the substrate for the detectors are addressed line by line. In FIGS. 2 and 3, it has been chosen to arrange the addressing means, on each module 4, at right angles to the network of detectors. A screen which is opaque to the radiation to be detected, and which is not depicted, protects the addressing means.

Each module also has its own reading means 3. It can be seen in FIG. 3 that these means 3 are borne on the lower side of the substrate, i.e. they are located on that side of the substrate 5 which does not carry the detectors. A screen 6, which is opaque to the radiation to be detected, is interposed between the insulating substrate 5 and the reading means. Connections link the column connections located on the upper surface of the substrate to the reading means 3. These connections are not depicted in the FIGS. 2 and 3. These connections follow one of the side surfaces of the substrate so as to minimize the interval "i" which must be made between two neighboring modules. Generally, an interval which is smaller than or equal to the pitch of the detector rows is tolerated.

A panel for X-ray photography according to the invention therefore comprises a number of outputs equal to the number of modules which constitute it. These outputs can be linked to a parallel/series multiplexer.

The radiation to be detected generally comprises X-rays. The rays may also be neutron rays. For all types of radiation used in radiology, a scintillator is used: it is placed in front of the network of detectors and transforms this radiation into visible radiation to which these detectors are sensitive. The scintillator does not completely absorb the radiation to be detected. This is why a screen opaque to this radiation is interposed between the substrate and the reading means. Similarly, the addressing means are protected by a screen which is opaque to radiation.

By their constitution, the detectors are less sensitive to the radiation to be detected than the addressing and reading means. Every attempt will be made to set up networks of detectors comprising only diodes and capacitors, and not switching-over elements such as transistors which are more sensitive to X-rays.

In the following part of the description, we shall return to a part of the content of the French patent application No. 86.00716, referring to FIGS. 4 to 10 which are derived from this patent application. We shall then show the modifications made by the invention, which is the object of the present patent application, to the devices described in the French patent application No. 86.00716.

In FIG. 4, which depicts a general view of a photosensitive matrix, a number np of photosensitive elements, each comprising a photodiode D in series with a capacitor C, are arranged according to the rows and columns of a matrix of p rows and n columns, the diodes of one and the same row are linked to one another by a row connection while the capacitors C of one and the same column are linked to one another by a column connection. The row connections are linked to an addressing voltage $V_P$ by means of switching MOS transistors, $j_1, j_2 \ldots j_P$ controlled by the outputs $v_1, v_2 \ldots v_P$ of a shift register known as a vertical shift register RV. This register is controlled by a vertical shift control signal $C_{DV}$. Thus, when a row is selected for reading, all the diodes of this row are carried to the high level $V_{PI}$ of the addressing potential $V_P$. In the same way, the capacitors of one and the same column are linked to the inputs of the operational amplifiers mounted as integrators, by means of switching MOS transistors $i_1 i_2 \ldots, i_n$ controlled by the outputs of the horizontal shift registers.

Multiplexing is effected for the columns of the matrix so as not to use one integrator amplifier per column: several successive columns are linked to the input of one and the same integrator operational amplifier. The reading means therefore comprise M amplifiers, M being a divider of n, and M horizontal shift registers, each amplifier and the associated horizontal shift register being used for the reading of n/M columns. Thus, the first n/M columns are linked to the outputs of a horizontal shift register $RH_1$ with n/M stages, the connections of the corresponding columns being linked to the negative (−) input of an operational amplifier $G_1$ mounted as an integrator; its output is linked to its negative (−) input by means of a reading capacitor $C_{L1}$. The (+) input of this integrator is linked to a column reference potential point $V_{CO}$.

This structure is repeated for each packet of n/M columns, the last amplifier $G_M$ linking the last n/M columns. The integration capacitors $C_L$ are zeroized by switches $i'_1 \ldots i'_M$ controlled by zeroizing pulses, $V_{RAZ}$. Finally, the columns can all be initialized together at the column reference potential $V_{CO}$ by a row of MOS transistors, $i''_1, i''_2 \ldots i''_n$ controlled by level reset pulses $V_{RAN}$. The horizontal shift registers are controlled simultaneously by a horizontal shift control signal $C_{DH}$ applied to their control inputs, their outputs of the same level being synchronized and giving signals $h_1 h_2, \ldots, h_{n/M}$. The output voltages of the integrating amplifiers are $V_{S1} \ldots V_{SM}$.

FIG. 5 is the detailed equivalent diagram of a photosensitive element with a diode D and a capacitor C, with the various addressing controls and the corresponding output amplifier. When this photosensitive element is selected by the vertical register RV of FIG. 1, the corresponding switch j is shut by the control v and the potential $V_p$ is applied to the diode D. The capacitance $C_D$ of the diode has been depicted in parallel on this diode D. The common point of the diode D and the capacitance C has been designated by A, the other end of the capacitance C being linked to the negative (−) input of the integrator operational amplifier G by means of the switching MOS transistor i controlled by the output h of a column-selecting horizontal shift register. The capacitance of the columns connection $C_c$ has been depicted between this very same terminal of C and the earth.

The graphs of FIGS. 6a to 6h depict the various signals applied or obtained during the reading of a photosensitive element.

The French patent application No. 86.00716 is not limited to radiology, and the following description of FIGS. 6a to 6h, 9a to 9h and 10a to 10h must be adapted to radiology where the panel is not read when it is exposed to radiation and where the level-resetting operation is done for the entire panel at the same time, before exposure.

If the reading operations of the $i^{th}$ row are considered, all the diodes of this row have been polarized in reverse by the previous reading of this same row, one duration $T_i$ previously, this duration being at least the duration needed for reading all the other rows. The common points A between the diode D and the capacitance C of the photosensitive elements of this line are then polarized positively and are left in a floating state throughout the duration $T_i$, this duration being also advantageously used to integrate the light data to be recorded by this row. The photocurrent, proper to each diode, reduces the potential of each point A, in varying degrees, through the discharge of each capacitive couple formed by the capacitance C and the capacitance of the diode $C_D$, as can be seen in the FIG. 6f depicting the voltage at the terminals of a diode, where the unbroken lines and the broken lines respectively depict examples where there is no useful light signal and where there is a useful light signal. $C_D$ is assumed to be small with respect to C, i.e. $C_D$ is smaller than or equal to C/10.

The row-reading operations can be broken down into two successive sequences:

Firstly, the sequential reading of the information stored at the points A of the different groups of n/M photosensitive elements, the M groups of columns being read simultaneously by means of M horizontal shift registers and M integrator amplifiers;

In a second phase, the simultaneous restoring of the initial potential $V_{A0}$ of the points A of the entire row, by a level-resetting operation, either by means of a negative polarizing pulse applied to this row followed by a blank reading, or by means of a calibrated uniform illumination applied selectively to the row of photodetectors, or again, by means of an intense light flash followed by a blank reading.

These two operations are performed by means of the shunting of the addressing voltage $V_p$ to the $i^{th}$ row by the vertical shift register RV which controls the closing of the switch $j_i$ corresponding to this row: the voltage applied to the row $V_p$ is zero throughout the duration $T_i$ and is equal to the high level of $V_p$, $V_{Pl}$ during the period of reading pulses $T_L$ as is shown by the FIG. 6b. The first sequence is a succession of n/M reading pulses, synchronous with the zeroizing pulses $V_{RAZ}$ which short-circuit the reading capacitors $C_L$ and the addressing pulses $V_{CO}.h$ applied to the positive inputs of the M amplifiers as depicted in the FIGS. 6c depicting $V_{CO}$ and $V_{RAZ}$, the FIGS. 6d and 6e depicting the logic products $V_{CO}.h_1$ and $V_{CO}.h_2$ corresponding to the addressing of the first two columns of each group. These column-addressing pulses $V_{CO}.h$ result from the logical combination of the pulses h that control the switches i and the pulses applied to the reference potential point of the columns $V_{CO}$. The pulses h frame the pulses $V_{CO}$ in such a way that, at the end of the reading period $T_L$, the column voltage is really brought back to the high level of $V_{CO}$ before the level-reset operation. The column-addressing and zeroizing pulses overflow on either side of the reading pulses $V_P$: the pulses $V_P$ move to the upper level $V_{Pl}$ after the pulses $V_{CO}$ have moved to the low level. The reading pulses are therefore transmitted only to the columns selected by the horizontal shift registers, the other columns remaining charged at the upper level of $V_{CO}$.

FIG. 6f describes the development of the potential $V_A - V_P$ at the terminals of the diodes of the columns 2, n/M+2, 2n/M+2, etc. During the addressing of the previous columns 1n/M+1, 2n/M+1 . . . , since the other columns remain at the upper level, the pulse at $V_P$ should have an amplitude $V_{Pl}$ which is insufficient to polarize their diodes directly, in the absence of useful radiation, $V_{ASO} \geq 0$, and also in the presence of radiation $V_{AS} \geq 0$. This is what appears in the FIG. 6f which depicts, in addition to the voltage $V_A - V_P$ as a function of time, the characteristic of the diode: $I_D$ current in the diode: current $I_D$ as a function of $V_A - V_P$ voltage at its terminals. As indicated above, the solid line represents the potential in the absence of illumination, the broken line represents the potential of a diode that has integrated a light datum $Q_S$ during the integration period $T_i$. $V_A$ represents the amplitude of the signal stored in the capacitor C, the charges $Q_S$ being equal to the product of amplitude $V_A$ and the value of the capacitor C, i.e. $C \times V_A$.

The amplitude of the voltage variation at the terminals of the diode during the passage of $V_P$ to the top level $V_{Pl}$ is close to the amplitude variation of $V_P$. The reading of the following M columns 2, n/M+2 . . . is done by the coincidence of a pulse $V_P$ with the corresponding addressing voltage represented by the logic product $V_{CO}.h_2$ at these columns. In this case, the amplitude of the voltage variation at the terminals of the diode should be sufficient to polarize the diode largely in direct mode, even in the absence of a useful light signal, at the level $V_{ASO} - A_{Pl}$, course in the presence of the signal $V_{AS} - V_{Pl}$. If this condition is achieved, the voltage at the terminals of the diode evolves during the reading time $T_L$ up to a value $V_C$ which is independent of the initial polarizing voltage and is therefore independent of the signal. This voltage is the step-knee voltage of the diode D. In this case, the signal charge is integrally transmitted to the capacitor $C_L$ of the corresponding integrator amplifier, regardless of its amplitude. It is added to a charge $Q_0$ which is the charge read in the absence of the signal. The integrator $G_1$, $C_{L1}$ then delivers an output voltage of $V_{S1}$ in the presence of the light signal at the column 2 which corresponds to the useful charge $Q_S$ and to $Q_O$. The output voltage $V_{S1}$ corresponds to $$\frac{Q_S + Q_0}{C_L}.$$

This voltage is available directly after the voltage $V_P$ returns to zero and can then be taken by a sampling device before the return to zero by $V_{RAZ}$. The signals $V_{CO}$ and $V_{RAZ}$ are in phase but may have different levels.

When $h_2.V_{CO}$ returns to the top level, the diode D is more strongly polarized in reverse than initially, owing to the reading of the charge $Q_0 + Q_S$ for the potential of the point A is written:

$$V_A = V_{AO} + \frac{Q_O + Q_S}{C + C_D}$$

When all the other columns are being read, the diode stays polarized in reverse without being affected by the variations in potential of $V_P$.

At the end of n/M pulses of $V_P$, the reading sequence of the columns is completed for the row i. The level-resetting stage of all the floating points A of the diodes of this row is then done. The purpose of this level-resetting operation is to restore a potential of $V_{AO}$ to the diodes such that the $V_P$ pulses cannot polarize them directly during a reading even for maximum illumination, and, at the same time, such that the sum of the amplitudes of $V_P$ and $V_{CO}$ polarize them strongly in direct mode, even in the absence of the signal. This double condition can be used to select the reading of each diode by the coincidence of the row control pulses, by $V_P$, and the column control pulses by $V_{CO}$ according to the above description.

To obtain the required potential $V_{AO}$ it is necessary, first of all, to discharge the couple of capacitors C and $C_D$ which have been re-charged by the previous reading operation to a voltage of greater than $V_{AO}$ where the diode can no longer be read suitably. Several methods are possible to carry out this discharging operation; either the use of reverse conduction of the diode beyond a certain threshold or an intense or uniform illumination depending on the applications considered.

In using the diode reverse conduction threshold, the level-setting operation illustrated by the diagrams of signals of FIGS. 6a and the following figures consists in applying a negative pulse with an amplitude of $V_{P2}$ by $V_P$ which polarizes the diode beyond its reverse conduction threshold. This diode is discharged up to the reverse step-knee voltage $V_{CI}$, which is independent of the initial voltage. During this operation, as well as during the following one, all the columns are polarized at the top level of $V_{CO}$ by means of the MOS switching transistors $i''_1 . . . i''_n$ controlled for the level-resetting operation by $V_{RAN}$. This polarizing operation beyond the reverse conducting threshold is followed by a "blank" reading sequence at the end of which the final potential $V_{AO}$ can be adjusted by means of a reading pulse with a determined amplitude of $V_{PO}$. Thus, the polarizing charge $Q_0$ is adjusted independently of the value of the reverse step-knee voltage of the diode which may vary appreciably from one element to another, so that $V_C + V_{PO} + V_{CO} = V_{AO}$. At the end of this sequence, the floating potential of all the diodes of the $i^{th}$ line is restored to begin a new integration of the light data.

A matrix of photosensitive elements such as the one described above and depicted schematically in FIG. 4, can be made by following the procedure described below with reference to FIGS. 7a and 7b for a first alternative or with reference to FIGS. 8a and 8b for a second alternative. FIGS. 7a and 8a depict a cross-section of the matrix along a column, and FIGS. 7b and 8b depict a cross-section of the matrix along a row, for the two alternatives of the method respectively.

According to the first alternative, this matrix is made from amorphous silicon in the following way: a plate of glass 5 forming the substrate is lined in a first stage with a semi-transparent conductive layer 20, for example a layer of molybdenum tantalum or ITO (a mixture of indium oxide and tin oxide), this layer being subsequently etched to form the column conductors. A layer of dielectric material 30 is then formed, for example with tantalum oxide $Ta_2O_5$ with a high dielectric constant at a thickness of 0.2 $\mu$m, obtained by the anodic oxidation of the previous layer if this previous layer is made of tantalum, to form the capacitors. Then the layers of amorphous silicon, which are to form the PIN DIODES D, are deposited on this layer with a thickness of about 0.8 $\mu$m to 3 $\mu$m: for example, a layer of p+ doped silicon, 40, a layer of intrinsic silicon i, 50, and a layer of n+ doped silicon, 60. The etching of these superimposed layers then insulates the superimposed diodes from the dielectrical layer forming the capacitors, which are in contact with the lower conductor. An insulating shielding layer 70, made of silicon nitride or silicon oxide for example, is then deposited; finally, contacts are opened in the surface layer of insulating material 70 to make the row conductors. For this a layer of semi-transparent metal 80, ITO for example, is deposited; this layer is then etched to form the row conductors.

A scintillating screen 90 is deposited on the unit, the X image being projected on this surface of the matrix. If the re-levelling is done by illumination, as will be explained below, the level-resetting optical flashes are projected on the glass plate side 5, the scintillator being opaque to the visible radiation.

According to the second alternative, illustrated by the FIGS. 8a and 8b where the same layers as in FIGS. 7a and 7b carry the same references, the diodes are made before the capacitors, the capacitors being formed from the insulating layer 70, thus preventing the opening of contacts in this layer and preventing the depositing of the insulating layer 30. The layer 70 can obviously no longer be made by the oxidation of the lower semi-transparent conductor (tantalum). The succession of layers is then as follows: a semi-transparent conductive material 20 is deposited on the glass plate 5 and this material is then etched; then follow the layers of p+ doped silicon 40, intrinsic silicon 50 and n+ doped silicon 60. After etching to insulate the diodes, the layer 60 of dielectrical material 70 is deposited and forms the capacitor C. The final layer 80 of semi-transparent conductor is then deposited and etched.

The structure thus obtained for the matrix and the associated reading method has several advantages for a large-sized matrix photosensitive device for which a high resolution is desired:

The reading noise can be reduced;

The operating frequency of the horizontal shift registers can also be reduced by the factor M owing to the multiplexing;

The photosensitive element, which forms a capacitor/diode association, has a very simple structure which is resistant to X-radiation, a fact that constitutes a major advantage for a sensor designed for imaging by X-radiation, used with a scintillator.

Since the operating frequency of the horizontal shift registers is reduced, the registers can be made with transistors of reduced mobility, as is the case for a photosensitive matrix using an amorphous silicon type of material. This material is then used for the entire structure, thus considerably simplifying problems of connection.

It has been indicated above that the level-resetting operation, which is indispensable if the reading is to be repeated, can be done by uniformly illuminating the diodes so as to discharge them, this illumination having an intensity and a duration which are predetermined. The signs that explain the alternative method of reading which uses this level-reset operation are depicted in the FIGS. 9a–9h in an example of an application where the level-reset operation is done all at once for the entire matrix. The letter references of the FIG. 9a–9h and its following figures are identical to those used for the same signals in the FIG. 6 and its following figures. The structure of the pulses $V_P$ is modified as depicted in the curve of the FIG. 9b: the negative pulse needed at discharge for an electrical level-reset operation is eliminated. It is replaced by the calibrated illumination depicted in FIG. 9h which discharges all the diodes of the matrix, for a predetermined time, after the reading of all the rows of the preceding image. It is this discharge which sets the starting voltage $V_{AO}$; the blank reading pulse with an amplitude of $V_{PO}$ is also eliminated. The following reading pulses perform successive readings of the diodes of the matrix, in coincidence with the pulses $V_{CO}$, which are controlled by the horizontal registers. Each diode that has just been read must be sufficiently polarized in reverse so that it is no longer affected by the other pulses of the sequence. For it to be impossible for the diodes of this same row to be read by the coincidences $V_P$ and $V_{CO}$, intended for the reading of the following lines, it is important to choose the polarization charge background $Q_O$ as being greater than the maximum signal charge $Q_S$(max) so that the potential of the points A, after reading, $(V_A - V_P)T_L$ is always greater than $V_{AO}$. It is only after a new level-reset operation that the discharge leads to the potential of floating points $V_{AO}$ which is suitable for reading. In this alternative, unlike the others, the exposure to useful radiation can take place after the level-reset operation, as previously, but it can also take place before the level-reset operation or even at the same time. This may be the case for a permanent image input, in the case of a visible imaging device. The integraton at each row then takes place during the reading of all the other rows, but the level-reset sequence should take place between each reading of the entire matrix.

The level reset can also be attained by means of an intense illumination. The signals that explain the alternative reading method applying a level-reset operation of this kind are depicted in FIGS. 10a to 10h also for case of an application where the level-reset operation is done for the entire panel at one time. The intense, non-calibrated illumination, illustrated by FIG. 10h, discharges the capacitor C far more than would be necessary to return to the starting voltage $V_{AO}$. Then a blank reading is done by means of an additional reading pulse depicted in FIG. 10b, with a calibrated level $V_{PO}$, smaller than $V_{P1}$, similar to that introduced after a highly reversed polarization as in FIG. 6b. Thus the voltage at the point A of the diodes of the row to be read is brought to the necessary starting voltage $V_{AO}$, without the illumination being calibrated. Then a blank reading is made by means of an additional reading pulse depicted in FIG. 10b, with the calibrated level $V_{PO}$, smaller than $V_{P1}$, similar to that introduced after a highly reversed polarization as in FIG. 6b. Thus, the voltage at the point A of the row diodes to be read is brought to the necessary starting voltage $V_{AO}$, without the illumination being calibrated. A polarization charge $Q_O = C(V_{P1} - P_{PO})$ is then introduced. Owing to the fact that a blank reading is done to bring the voltage to $V_{AO}$, the useful information can be integrated only after the sequence to reset the level of the entire panel.

In X-ray picture photography, there is only one exposure and only one reading of the matrix. The level-reset operation is done for the entire matrix, prior to an exposure as indicated above. The reading can then be done row by row by means of an electronic addressing operation.

According to the present invention, the X-ray photography panel, described in the French patent application No. 86.00716, and illustrated in its structure, its working and its embodiment by the FIGS. 4 to 10, comprises several modules 4 set end to end as explained with reference to the FIGS. 2 and 3.

FIG. 11 depicts an exploded view of one of these modules 4.

It is clear that the manufacturing methods explained with reference to FIGS. 7a and b and 8a and b can be used to make these modules. The reference signs used in figures 7a and b and 8a and b will be purposely used in FIG. 11.

The module 4 of FIG. 11 comprises the following elements from top to bottom:

A scintillator screen 90;
Row connections 80;
Detectors d which may, without distinction, comprise a diode and then a capacitor as in the line 7a, or a capacitor and then a diode as in FIG. 8a;
Column connections 30;
An insulating substrate made of glass 5.

As explained with reference to FIGS. 2 and 3, each module 4 has its own addressing means 2 located on the upper surface of the insulating support 5, on the detectors side. Welded connection wires 7 join the row connections 80 to the addressing means 2 which may comprise, as in the example of FIG. 4, a shift register and MOS transistors.

Figure 12:
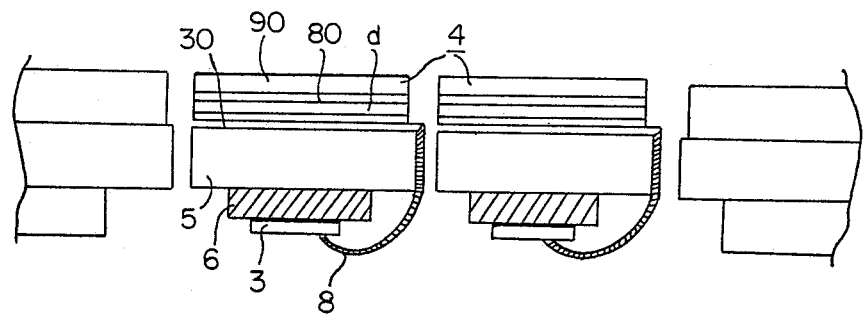
FIG. 12 is a cross-section view of a panel comprising modules such as the module of FIG. 11.

FIG. 12 is a cross-section view of a panel according to the invention comprising modules 4 such as the one depicted in FIG. 11.

As was explained in the description of FIGS. 2 and 3, each module has its own reading means 3, which may comprise, as in the example of FIG. 4, a shift register, an operational amplifier mounted as an integrator and MOS transistors. The reading means 3 are carried on the lower side of the substrate 5, from which they are separated by a lead screen 6. Connections 8, which follow one of the side surfaces of the substrate 5, link the column connections 30 to the reading means 3.

FIG. 12 depicts that part of these connections 8 10 which follows a side surface of the substrate 5. This part of the connections 8 may comprise a metallization borne by the side surface of the substrate. The other part of these connections, which joins the reading means, may comprise welded flexible connections.

It has been noted in the description of FIGS. 4 to 10 that for radiology, it is necessary to illuminate all the panel detectors to perform a level-reset operation before any new registration of useful data.

This illumination cannot be done on the scintillator side which is generally opaque.

The invention proposes a structure suited to this need to illuminate the panel.

FIG. 13 depicts a cross-section view of a module 4. This figure depicts, in a more detailed way than in figure 12, the shapes of the scintillator 90, row connections 80, and detectors d.

The only difference between the module of FIG. 13 and those of FIG. 12 lies in the presence of a light-generating panel 9 which is interposed between the lower surface of the substrate 5 and the screen 6 which carries the reading means 3. This light-generating panel 9 may comprise a network of light-emitting diodes. The insulating substrate 5 must then be transparent. A glass substrate is perfectly suitable. With respect to the column connections 30, in the manufacturing methods illustrated by FIGS. 7a and b, and 8a and b, it is said that these connections can be made up of semi-transparent conductive material for example, molybdenum, tantalum or ITO (a mixture of indium oxide and tin oxide). Thus, insofar as the column connections 30 are semi-transparent, they can be used to illuminate the detectors by means of the panel 9.

FIGS. 11, 12 and 13 have been described in the context of the X-ray photography panel which was the object of the French patent application No. 86.00716. It is clear that X-ray photography panels, different by their detectors, their addressing and/or reading means, may be equally well made as in the FIGS. 2, 3, 11, 12 and 13 by modules made on either side of an insulating substrate.

In the description of FIGS. 2 and 3, it is explained that the connections linking these column connections $C_l$ to $C_n$ to reading means 3, located on the side opposite to the insulating substrate 5, followed one of the side surfaces of the substrate 1 so as to minimize the interval i which must be made between two neighboring modules. This interval should be less than 200 micrometers in an example of an embodiment. It is necessary that this passage for the connections from one side of the substrate to the opposite side should be compatible with the end-to-end joining of the modules to one another. The technology used should be compatible with the other stages of manufacture of the modules, for example, the depositing of amorphous silicon, the etching, etc. Finally, this technology should be dependable enough to make the very many connections between the column connections and the reading means, for example, about 2000 connections for a panel.

A great number of technologies can be used to make these connections. In the description of FIG. 12, it was pointed out that these connections could, for example, comprise a metallization carried on the side surface of the substrate and then by welded, flexible connections linked to the reading means.

Another object of the present invention is a method for the manufacture of column connections and their connections with the reading means which will be described with reference to FIGS. 14 and 15.

FIG. 14 depicts the insulating substrate 5 which will be used as a support for the modules.

A flexible insulating support 11, bearing the conductors 8, is bonded to one of the side surfaces of this insulating substrate 5. The insulating material used may be polyimide (for example, Kapton, bearing flexible copper conductors).

This insulating support 11 is lapped so that the ends of the conductors 8 are located in the same plane as the top surface of the insulating substrate 5, intended to carry the detectors. The lapping can be done by polishing for example.

Then, on the upper side of the substrate 5, the column connections $C_l$ to $C_n$ are deposited in such a way that, at the end of the substrate, these connections $C_l$ to $C_n$ overlap the connections 8 borne by the flexible insulating support 11.

The column connections $C_l$ to $C_n$ can be made, for example, as follows. A metallic deposit is made on the upper surface of the substrate 5 by evaporation in a vacuum for example. The metallic deposit is lined with photosensitive resin and then a photo-etching is made by using a mask indexed on the conductors carried by the flexible insulating support 11 so that, at the end of the substrate, the column connections overlap the conductors borne by the flexible insulating support so as to provide an electrical contact.

After this, the various stages needed to make the module are performed; these include, for example, the stages described with respect to the FIGS. 7a and b, and 8a and b. During these stages, the temperature should not exceed about 250° C., in the example where a polyimide flexible insulating support is used. The flexible conductors 8 carried by the flexible insulating support 11 are connected to the reading means by micro-welds.

During the application of the method which has been described, a problem is encountered due to the generally rectangular shape of the insulating substrate 5 designed to constitute a module generally comprising more columns than rows of a X-ray photography panel according to the invention. This problem arises when depositing the photosensitive resin, used to make the connections of the column $C_l$ to $C_n$ by photo-etching, on the upper surface of the substrate 5.

When there is a square-shaped substrate, there is no difficulty in placing it on an instrument which causes its rotation. The substrate rotates at high speed, and photosensitive resin is deposited on its upper surface and spreads in a film of a constant thickness.

For a square-shaped substrate, difficulties are encountered because the rotation is not perfect and it is observed that the resin does not spread suitably.

The resin is then deposited by dipping and withdrawal of the substrate 5.

The disadvantage of this type of depositing is that it causes an excessive thickness of the resin at the edge of the substrate. This excess thickness alters the resolution during photo-etching, i.e. the insolation time has to be greater at the periphery of the substrate than at its center.

To resolve this problem it is proposed to modify the method explained with reference to FIG. 14 as follows.

As depicted in FIG. 15, which is a cross-section of the substrate 5 and one of the connections $C_l$ to $C_n$, namely $C_i$, on its upper side, an insulating flexible support 11, carrying the conductors 8, is still bonded to one of the side surfaces of the substrate 5.

Then, a short extension (a few millimeters) is made, along the side surface of the substrate 5 on which the flexible insulating support 11 is bonded. This extension of the side surface of the substrate 5 can be made, for example, by means of epoxy resin which can be used to bond the flexible insulating support 11 to the substrate.

The flexible insulating support 11 is lapped so that the ends of the conductors 8 are located in the same plane as the upper surface of the insulating substrate 5 intended to carry the detectors.

To make the column connections, a metallic layer is deposited on the upper surface of the substrate 5 by evaporation in a vacuum, for example.

Then photosensitive resin is deposited by the dipping and withdrawal of the substrate 5. FIG. 15 shows the 10 layer of photosensitive resin 12 thus obtained, in broken lines. This layer has an excess thickness 13 at the end of the substrate.

Then a photo-etching is done by using a mask indexed on the conductors borne by the flexible insulting support 11 as was done previously.

Then the effect of the excess thickness of the photosensitive resin is removed by lapping a part of the side surface of the substrate which has been previously added.

It is possible, for example, to lap this side surface up to the dot-dash vertical line as indicated in FIG. 15. By shifting the contact zones between the horizontal and vertical connections from the edge (during manufacture), the edge effects, which may harm the dependability of these contacts during subsequent manufacturing stages, are eliminated. The connections carried by this flexible insulating support are connected to the reading means by welding either before or after the grinding of the side surface. It is clear that the invention can be applied to X-ray photography panels, regardless of the detectors used in these panels. Thus, these detectors do not necessarily comprise a photodiode linked in series with a capacitor as is the case with FIGS. 4 to 13.

For example, an X-ray photography panel is known in which each photosensitive element comprises a photodiode and a capacitor in series with a switch can be made for example, with a MOS transistor or two head-to-foot arranged diodes.

The invention can be applied regardless of the alternatives that X-ray photography panels may comprise, with respect to the detectors as well as the addressing and reading means. The invention therefore applies to all types of X-ray photography panels comprising a network of detectors, row and column connections, a scintillator, addressing means, to address, successively, each row of detectors and means for reading the row of detectors addressed. The invention such as it is illustrated by the FIGS. 2, 3, 11, 12 and 13 can be applied to all these panels and the method of manufacture illustrated by the FIGS. 14 and 15 can also be applied to all these panels.

What is claimed is:

1. An x-ray photography panel comprising photosensitive detectors, borne by an insulating substrate, arranged in rows and columns, linked to one another by row connections and column connections, and receiving radiation to be detected by means of a scintillator, with means linked to the row connections being used for the successive addressing of each row of photosensitive detectors and means connected to the column connections providing for the reading of the row of photosensitive detectors addressed, said panel comprising several modules, placed end to end, each module comprising a network of photosensitive detectors with the same number of columns as the panel but with a smaller number of rows, each module having its own addressing and reading means, the addressing means of each module located on an edge of the insulating substrate on the detectors side, and being protected from the radiation to be detected by a screen, the reading means being located on the other side of the insulating substrate from the photosensitive detectors, with a screen which is opaque to the radiation to be detected being interposed between the insulating substrate and the reading means, the reading means linked to the column connections coming from the side opposite to the insulating substrate by connections following one of the side surfaces of the insulating substrate.

2. A panel according to claim 1, wherein each module is made on a substrate, one of the surfaces of which comprises the superimposition of column connections, photosensitive detectors, row connectors, the scintillator and the addressing means being arranged on an edge of the substrate and the other side of the substrate comprising the superimposition of a screen for protection from the radiation to be detected and the reading means.

3. A panel according to claim 1, wherein the substrate is transparent to visible radiation and wherein a luminous panel, which transmits visible radiation upon a command, lines that surface of the substrate which carries a screen opaque to the radiation to be detected and the reading means.

4. A panel according to claim 3, wherein the luminous panel which transmits a visible radiation upon a command, is a panel of light-emitting diodes.

5. An x-ray photography panel comprising photosensitive detectors supported by an insulating substrate, said photosensitive detectors arranged in rows and columns linked to one another by row connections and column connections said panel receiving radiation to be detected by means of a scintillator, with addressing means linked to the row connections for successive addressing of each row of photosensitive detectors and means connected to the column connections providing for the reading of an addressed row of photosensitive detectors, said panel comprising several modules placed end to end, each module comprising a network of photosensitive detectors with the same number of columns as the panel but with a smaller number of rows, said addressing means comprising a module addressing means for each module and said reading means comprising a module reading means for each module, the module addressing means of each module located on an edge of the insulating substrate on the detector side, said module addressing means protected from the radiation to be detected by a screen, the module reading means being located on the other side of the insulating substrate from the photosensitive detectors, with a screen which is opaque to the radiation to be detected being interposed between the insulating substrate and the module reading means, the module reading means linked to the column connections coming from the side opposite to the insulating substrate by connections following one of the side surfaces of the insulating substrate, wherein said column connections comprise connections deposited on one surface of the insulating substrate on the detector side, and further comprise connections deposited on a flexible, insulating support which is bonded to a side surface of the insulating substrate, said further connections being welded to said reading means.

6. A panel according to claim 5 wherein each module is supported on an insulating substrate, one of the surfaces of which comprises the superimposition of column connections, photosensitive detectors, row connections, the scintillator and the module addressing means being arranged on an edge of the substrate and the other side of the substrate comprising the superimposition of a screen for protection from the radiation to be detected and said module reading means.

7. A panel according to claim 5 wherein the insulating substrate is transparent to visible radiation an wherein a luminous panel, which transmits visible radiation upon command, lines that surface of the insulating substrate which carries a screen opaque to the radiation to be detected and the module reading means.

8. A panel according to claim 7 wherein the luminous panel which transmits a visible radiation upon a command is a panel of light emitting diodes.

9. A method for manufacturing a panel for x-ray photography, which panel comprises photosensitive detectors supported by an insulating substrate and arranged in rows and columns, said photosensitive detectors linked to one another by row connections and column connections, and receiving radiation to be detected by means of a scintillator, with addressing means linked to the row connections for addressing of each row of photosensitive detectors and reading means connected to the column connections provided for reading a row of addressed photosensitive detectors, the panel comprising several modules placed end to end, each module comprising a network of photosensitive detectors with the same number of columns as the panel but with a smaller number of rows, said addressing means comprising a module addressing means for each module, said reading means comprising a module reading means for each module, wherein said method for implementing said column connections and connections to said module reading means comprises the steps of:

(1) bonding, a flexible insulating support bearing conductors, to one of the side surfaces of the insulating substrate, (2) lapping said flexible insulating support so that ends of connections borne by the support are located in a plane common with that side of said insulating substrate supporting said photosensitive detectors, (3) depositing column connections on the detector side of said insulating substrate so that at an end of the substrate, deposited connections overlap the conductors borne by said flexible insulating support, and (4) welding those conductors borne by said flexible insulating support to the module reading means.

10. A method according to claim 9 wherein said lapping step is implemented by polishing.

11. A method according to claim 9 wherein during said step (3) said column connections are deposited by evaporation in a vacuum followed by depositing a photosensitive resin and followed by a step of photo etching said photosensitive resin.

12. A method according to claim 11 wherein said photosensitive resin is deposited by dipping said insulating substrate and then withdrawing said insulating substrate.

13. A method according to claim 12 wherein after said step (1), side surfaces of the insulating substrate are extended a small distance and following said step (3) the substrate is thereafter lapped so as to appreciably eliminate that part by which said substrate had been extended.

* * * * *